(12) United States Patent
Dakhil

(10) Patent No.: US 10,632,420 B2
(45) Date of Patent: Apr. 28, 2020

(54) CARBON DIOXIDE CAPTURE, STORAGE, CONVERSION AND POWER SYSTEM

(71) Applicant: Farouk Dakhil, Rome (IT)

(72) Inventor: Farouk Dakhil, Rome (IT)

(*) Notice: Subject to any disclaimer, the term of this patent is extended or adjusted under 35 U.S.C. 154(b) by 0 days.

(21) Appl. No.: 16/034,422

(22) Filed: Jul. 13, 2018

(65) Prior Publication Data
US 2020/0016535 A1 Jan. 16, 2020

(51) Int. Cl.
| | | |
|---|---|---|
| *B01D 53/86* | (2006.01) | |
| *H01M 8/22* | (2006.01) | |
| *H01M 16/00* | (2006.01) | |
| *C01B 32/60* | (2017.01) | |
| *H02K 7/18* | (2006.01) | |
| *H02K 11/00* | (2016.01) | |
| *H01L 35/30* | (2006.01) | |
| *B01J 19/00* | (2006.01) | |
| *B01D 53/62* | (2006.01) | |
| *H01M 8/1018* | (2016.01) | |

(52) U.S. Cl.
CPC ........ *B01D 53/8671* (2013.01); *B01D 53/62* (2013.01); *B01J 19/00* (2013.01); *C01B 32/60* (2017.08); *H01L 35/30* (2013.01); *H01M 8/227* (2013.01); *H01M 16/006* (2013.01); *H02K 7/1823* (2013.01); *H02K 11/0094* (2013.01); *B01D 2255/20753* (2013.01); *B01D 2257/504* (2013.01); *H01M 2008/1095* (2013.01)

(58) Field of Classification Search
CPC ............... B01D 53/8671; B01D 53/62; B01D 2255/20753; B01D 2257/504; B01J 19/00; H01L 35/30; H02K 11/0094; H02K 7/1823; C01B 32/60; H01M 16/006; H01M 8/227; H01M 2008/1095
USPC ................ 60/641.8, 643, 645, 650, 682–684
See application file for complete search history.

(56) References Cited

U.S. PATENT DOCUMENTS

| | | | | |
|---|---|---|---|---|
| 9,382,120 | B2 * | 7/2016 | Dakhil | ............... C01B 32/60 |
| 2010/0135882 | A1 * | 6/2010 | Constantz | ......... B01D 53/1425 |
| | | | | 423/234 |
| 2014/0234946 | A1 * | 8/2014 | Constantz | ............. C12M 21/18 |
| | | | | 435/266 |
| 2015/0211489 | A1 * | 7/2015 | Dakhil | ................... B01D 53/02 |
| | | | | 290/50 |
| 2015/0252352 | A1 * | 9/2015 | Corgie | .................... A62D 3/02 |
| | | | | 210/606 |

OTHER PUBLICATIONS

Virginia Tech, "Researchers develop a new model to unlock catalytic powers of gold", Physical Review Letters, Mar. 2017; 2 pgs. https://phys.org/news/2017-03-catalytic-powers-gold.html.

(Continued)

*Primary Examiner* — Hoang M Nguyen
(74) *Attorney, Agent, or Firm* — Maier & Maier, PLLC

(57) ABSTRACT

A system for capturing and storing carbon dioxide. The $CO_2$ sequestration system may include one or more sub-systems for generating electricity, a heat exchange system which may regulate temperature, and a conversion tank. The conversion tank may contain water with dissolved compounds and a catalyst. Carbon dioxide may be converted into carbonate minerals and drawn off to be used in any of a variety of applications.

19 Claims, 13 Drawing Sheets

(56) References Cited

OTHER PUBLICATIONS

Joshua A. Buss et al., "Four-electron deoxygenative reductive coupling of carbon monoxide at a single metal site", Nature, Jan. 2016, p. 72-75, vol. 529; 4 pgs.

Vanderbilt University, "New form of crystalline order holds promise for thermoelectric applications", Physical Review Letters, Nov. 2014; 3 pgs. http://phys.org/news/2014-11-crystalline-thermoelectricapplications.html.

Jennifer K. Balch, "Drought and tire change sink to source", Nature, Feb. 2014, p. 41-42, vol. 506; 2 pgs.

Tessa Evans, "Electrochemical cell converts waste heat into electricity", Physical Review Letters, Nov. 2014; 3 pgs. http://phys.org/news/2014-11-electrochemical-cell-electricity.html.

David Astrain et al., "Heat Exchangers for Thermoelectric Devices", Heat Exchangers—Basics Design Applications, Mar. 2012, p. 289-308; 21 pgs. http://www.intechopen.com/books/heat-exchangers-basics-design-applications/heat-exchangers-forthermoelectric-devices.

Aaron D. Lalonde et al., "Lead telluride alloy thermoelectrics", materialstoday, Nov. 2011, p. 526-532, vol. 14; 7 pgs.

Kevin Bullis, "Cost of Limiting Climate Change Could Double without Carbon Capture Technology", MIT News, Apr. 2014; 3 pgs. http://www.technologyreview.com/news/526646/the-cost-of-limiting-climate-change-could-double-without-carbon-capture-technology/?utm_campaign=socialsync&utm_medium=social-post&utm_source=facebook.

Kevin Bullis, "Averting Disastrous Climate Change Could Depend on Unproven Technologies", MIT News, Apr. 2014; 3 pgs. https://www.technologyreview.com/s/526411/averting-disastrous-climate-change-could-depend-on-unproven-technologies/.

M. Turek et al., "Renewable energy by reverse electrodialysis", the EuroMed, May 2006; 1pg. https://doi.org/10.1016/j.desal.2006.04.041Get rights and content.

Universiti Teknologi Mara, "Scientists develop novel system that recovers energy normally lost in industrial processes", Physical Review Letters, Mar. 2016; 2 pgs. http://phys.org/news/2016-03-scientists-recovers-energylost-industrial.html.

Mohammad Heiranian et al., "Water desalination with a single-layer $MoS_2$ nanopore", Nature Communications, Oct. 2015, p. 1-6; 6 pgs.

Wenzhuo Wu et al., "Piezoelectricity of single-atomic-layer $MoS_2$ for energy conversion and piezotronics", Nature, Oct. 2014, p. 470-477, vol. 514; 18 pgs.

Li-Dong Zhao et al., "Ultralow thermal conductivity and high thermoelectric figure of merit in SnSe crystals", Nature, Apr. 2014, p. 373-377, vol. 508; 17 pgs.

Gene Siegel et al., "Robust longitudinal spin-Seebeck effect in Bi-YIG thin films", Scientific Reports, Mar. 2014, p. 1-6; 6 pgs.

Bruce E. Logan et al., "Membrane-based processes for sustainable power generation using water", Nature, Aug. 2012, p. 313-319, vol. 488; 7 pgs.

\* cited by examiner

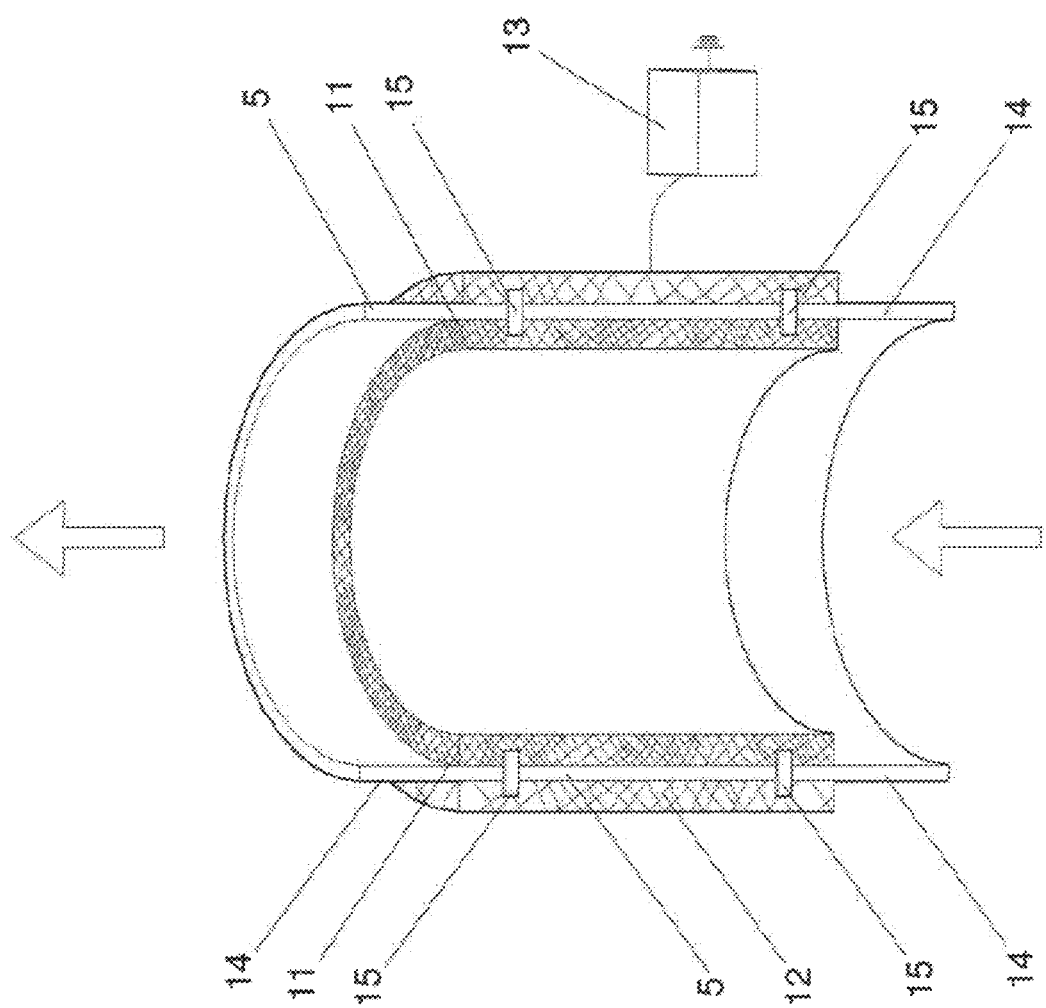

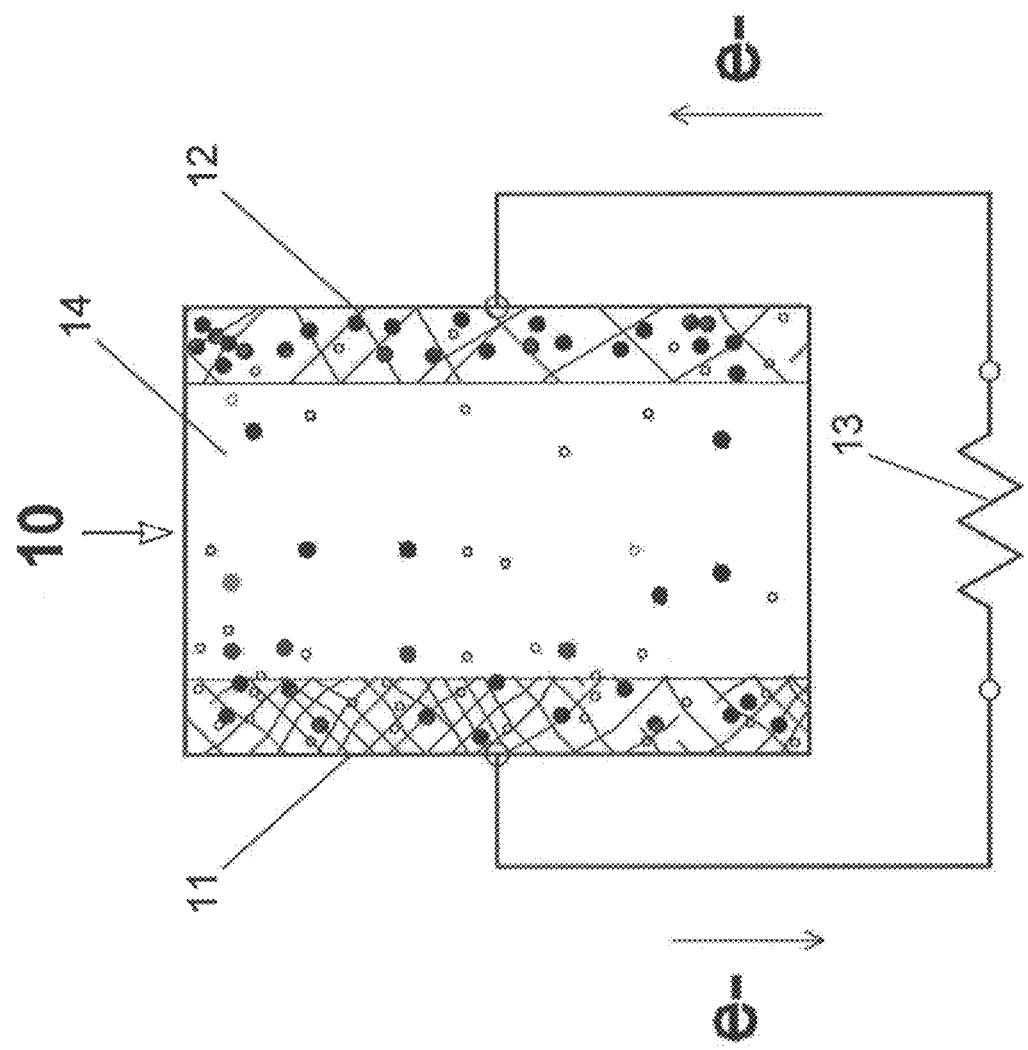

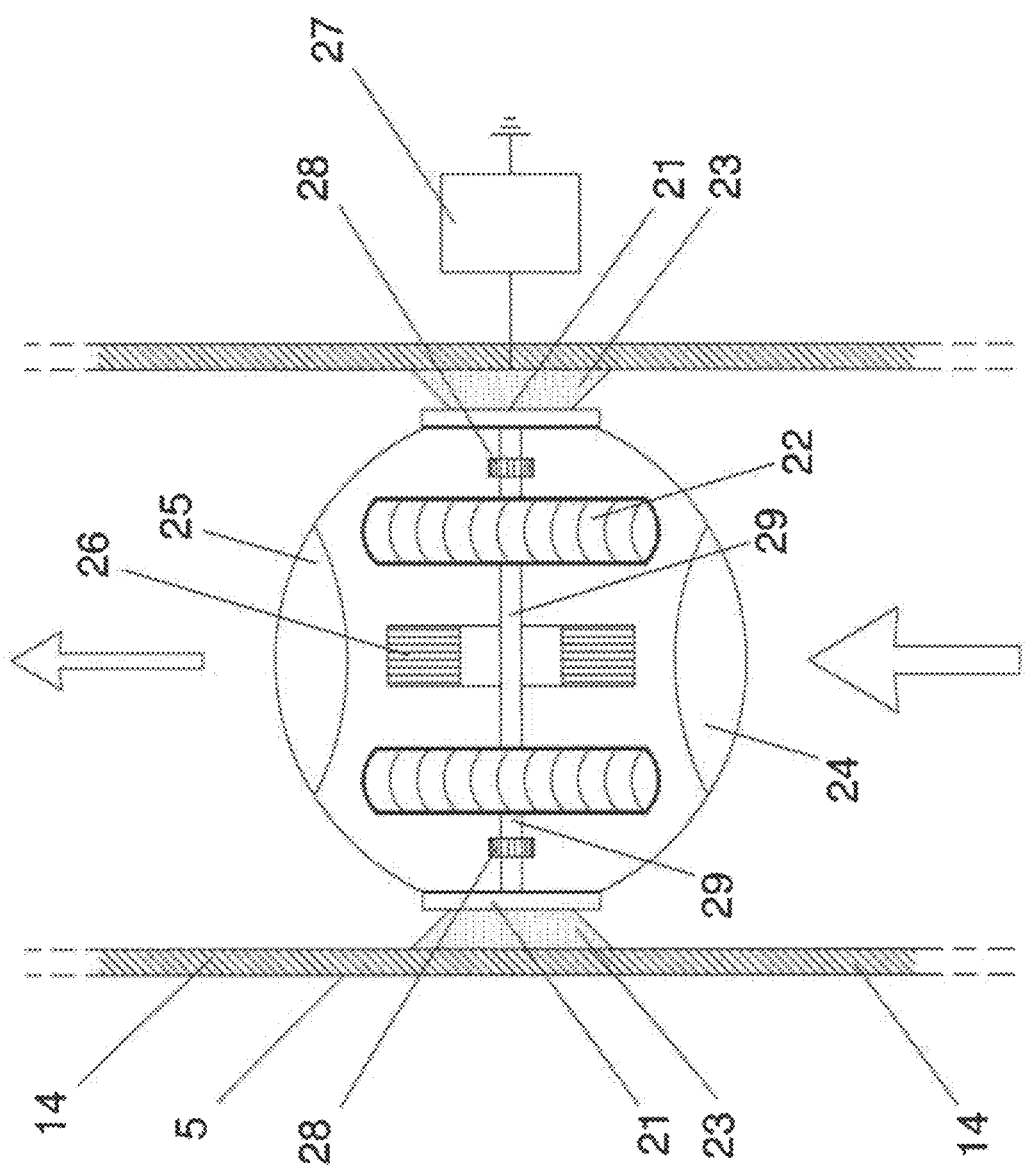

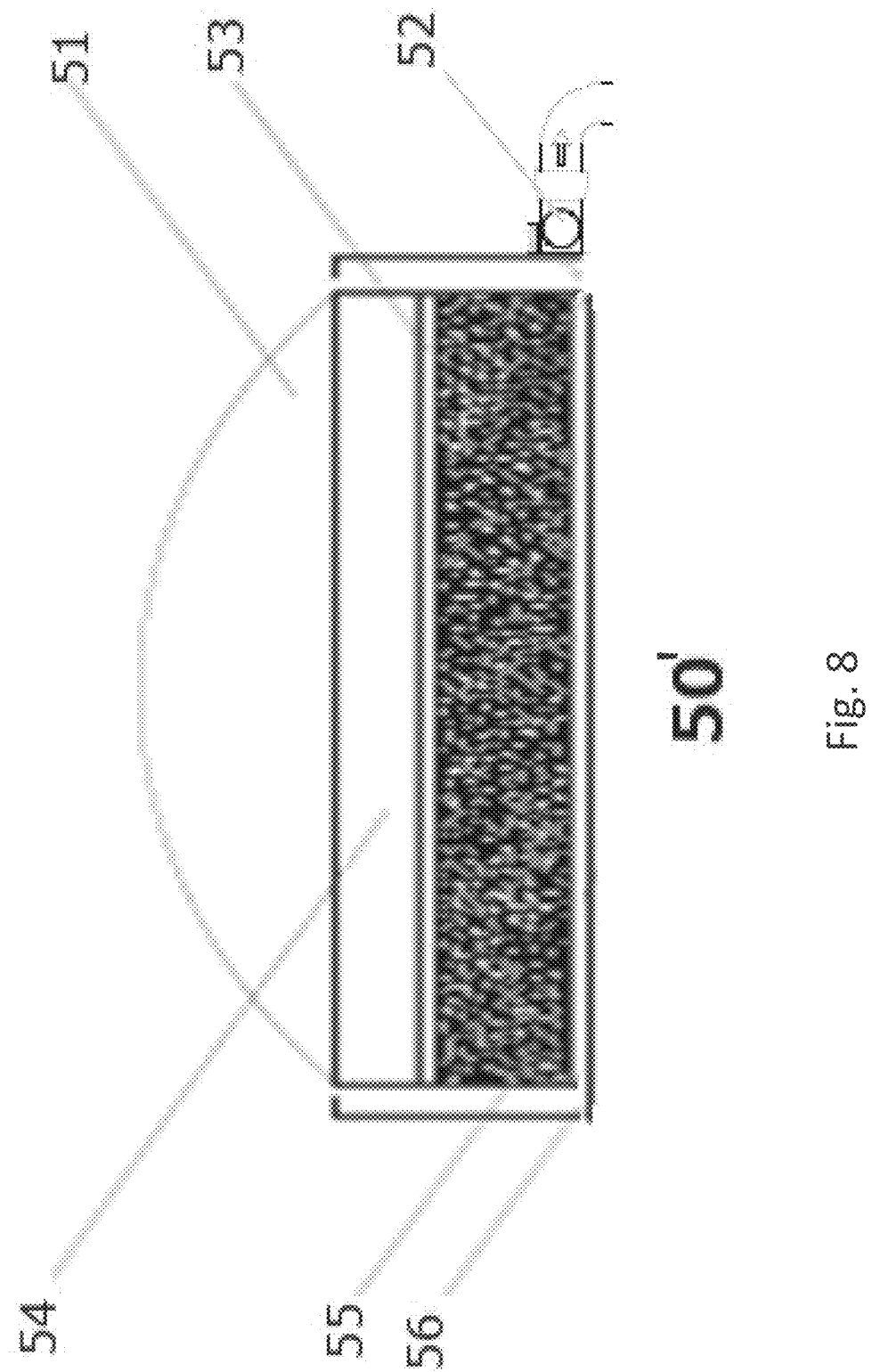

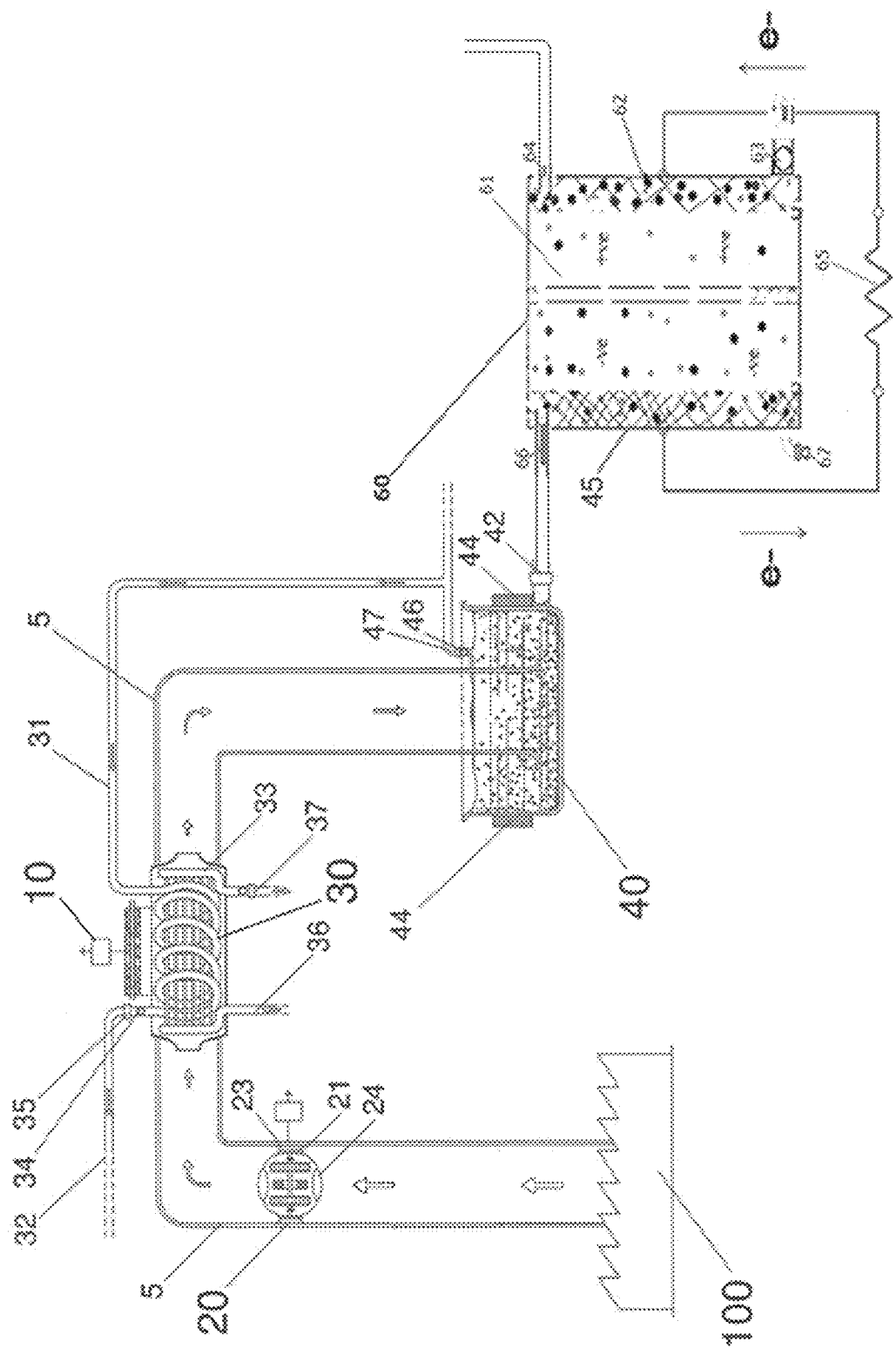

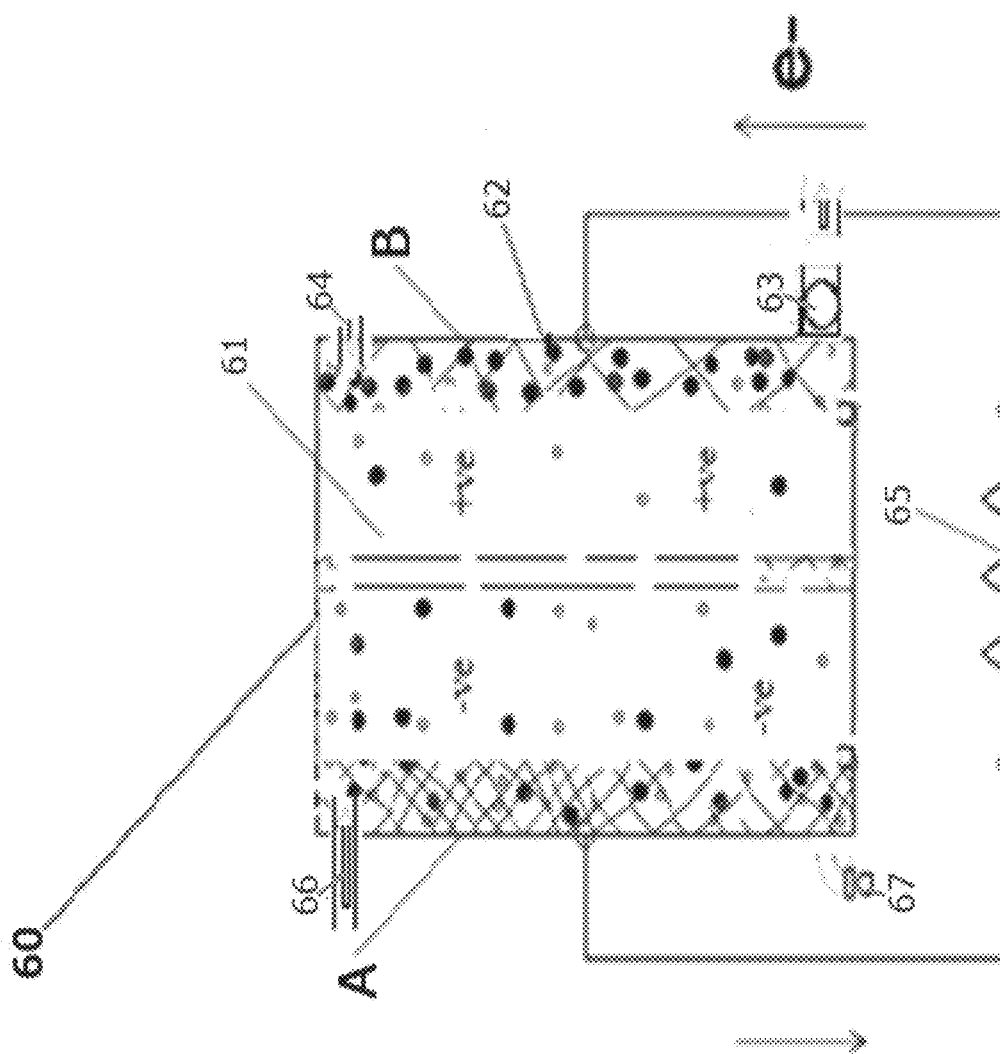

CARBON DIOXIDE CAPTURE, STORAGE, CONVERSION AND POWER SYSTEM

BACKGROUND

According to World's Metrological Organization, $CO_2$ concentration in the atmosphere have reached to 403.3 ppm (parts per million) by the end of 2016 which is around 45% above the preindustrial levels. (the critical level is 400 ppm). Also, according to the world's health organization (WHO) in 2017 air pollution, mainly due to $CO_2$ emissions, is causing more than 9 million deaths every year whereby trillions of $ are spent/lost to treat hospitalize effected people from said air pollutions around the world mainly in China and India.

There is increasing scientific evidence that global warming is caused by humans and made mainly by $CO_2$ emissions into the atmosphere, which is the culprit of climate change worldwide. There has been many proposals and solutions in scientific literature and NASA top scientists research. Some are fantastic, however, like bringing 16 billion small reflecting mirrors into the stratosphere by space rockets to reflect sun light from coming to earth and thus reduce global warming, others more dramatic in which rockets would injecting $SO_2$ into the atmosphere in order to reflect sun light whereby the ozone layer might be damaged by $SO_2$. Still another solution propose that some millions of artificial trees are installed into open space in which Natrium hydrocarbonate (NaOH) is placed in the artificial "leaves" structures to capture $CO_2$ that is then stored deep into the sea ground. The storage of $CO_2$ in deep geological porous rocks, kilometres deep into seafloor has proven to be instable and more $CO_2$ can significantly leak out into the atmosphere again. Another solution is to create artificial clouds by sending a fleet of some 40.000 unmanned vessels into the oceans that spray seawater particles into the atmosphere—by vertical-axis tidal currents—whereby clouds reflect sun light. Still another solution proposes that huge amounts of nitrogen granulates, a fertilizer (iron sulphate) is to be injected into deserted oceans in order to stimulate the growth of phytoplankton which can absorb much of the $CO_2$ present in the atmosphere. However, iron sulphate, in some cases, might kill a lot of fish. All these solutions may result in huge environmental impact and not necessarily a positive one and are most likely unworkable or has too big of a risk and/or collateral damage; besides it would cost billions.

Therefore, an effective solution is still required to reduce or prevent $CO_2$ emissions, such as minimizing $CO_2$ emissions at its source, i.e inside smoke stacks and/or exhaust pipes, before it is out in the atmosphere and at reasonable costs.

SUMMARY

According to at least one exemplary embodiment, a system for capturing and storing carbon dioxide may be disclosed. The $CO_2$ sequestration system may include one or more sub-systems for generating electricity, a heat exchange system which may regulate temperature, and a conversion tank. The conversion tank may contain water with dissolved compounds and a catalyst. Carbon dioxide may be converted into carbonate minerals and drawn off to be used in any of a variety of applications.

BRIEF DESCRIPTION OF THE FIGURES

Advantages of embodiments of the present invention will be apparent from the following detailed description of the exemplary embodiments. The following detailed description should be considered in conjunction with the accompanying figures in which:

Exemplary

Exemplary FIG. 2 shows detail of a thermocell for use with the carbon dioxide capture system Exemplary FIG. 2a shows a schematic diagram of a thermocell generating electricity Exemplary FIG. 3 shows detail of a pressure power generating device Exemplary

Exemplary FIG. 8 shows a solar chamber with the high concentration lens.

Exemplary FIG. 9 shows configurations for another embodiment of the CCSS with an ionic cell.

Exemplary FIG. 9a shows configurations of the ionic cell (IC) in which seawater is harnessed Exemplary

DETAILED DESCRIPTION

Aspects of the invention are disclosed in the following description and related drawings directed to specific embodiments of the invention. Alternate embodiments may be devised without departing from the spirit or the scope of the invention. Additionally, well-known elements of exemplary embodiments of the invention will not be described in detail or will be omitted so as not to obscure the relevant details of the invention. Further, to facilitate an understanding of the description discussion of several terms used herein follows.

As used herein, the word "exemplary" means "serving as an example, instance or illustration." The embodiments described herein are not limiting, but rather are exemplary only. It should be understood that the described embodiment are not necessarily to be construed as preferred or advantageous over other embodiments. Moreover, the terms "embodiments of the invention", "embodiments" or "invention" do not require that all embodiments of the invention include the discussed feature, advantage or mode of operation.

According to at least one exemplary embodiment, a system for capturing and storing carbon dioxide may be disclosed. The $CO_2$ sequestration system may include one or more sub-systems for generating electricity, a heat exchange system which may regulate temperature, and a conversion tank. The conversion tank may contain water with dissolved compounds and a catalyst. Carbon dioxide may be converted into carbonate minerals and drawn off to be used in any of a variety of applications.

Figure 1:
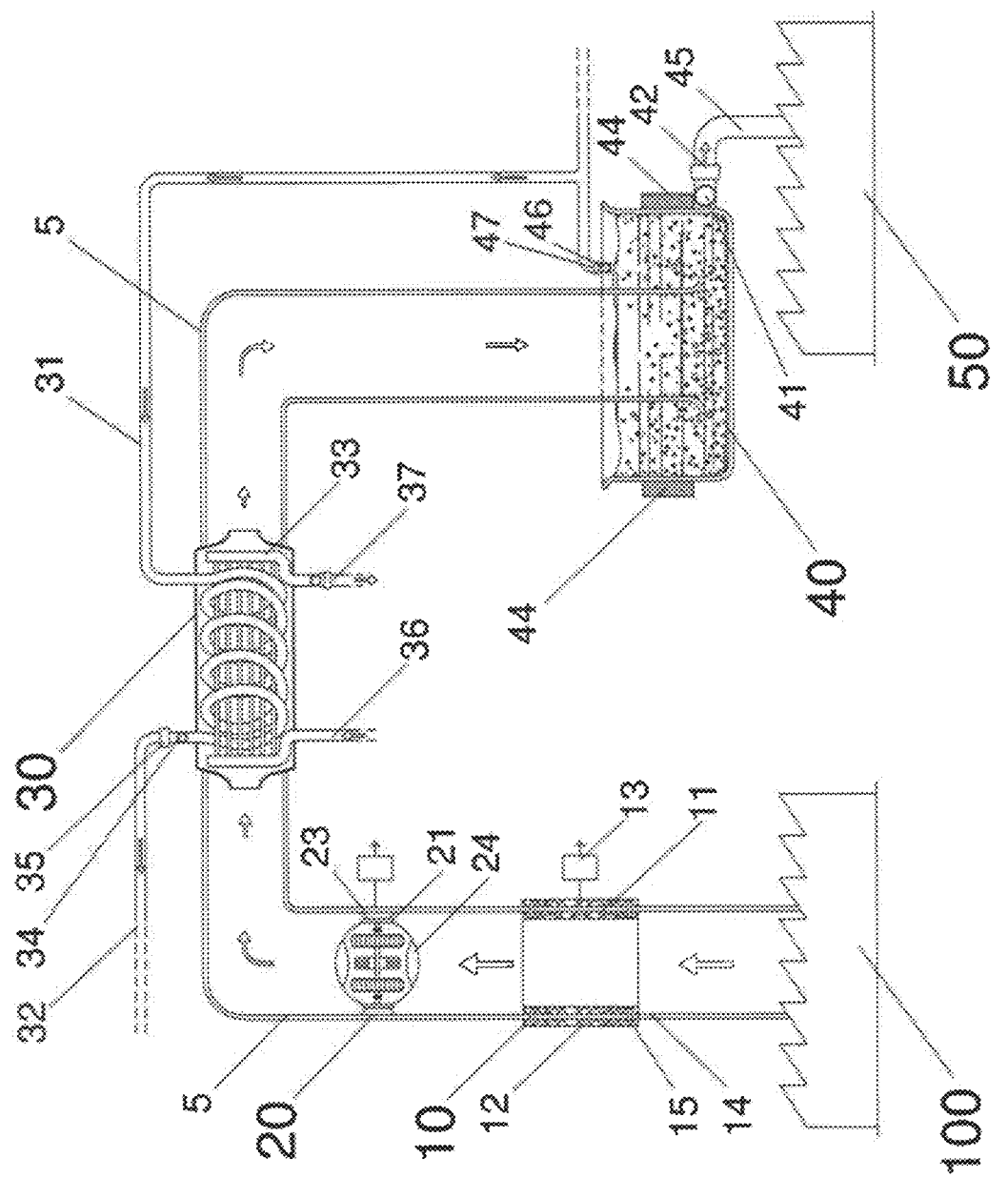
FIG. 1 shows a system diagram for a carbon dioxide ($CO_2$) capture and storage system (CCSS).

Referring to exemplary FIG. 1, a carbon dioxide ($CO_2$) capture and storage system (CCSS) may include a thermocell 10, a pressure power generating device (PPG) 20, a heat exchange unit 30, and a conversion tank 40. The CCSS may be integrated into a pathway 5 leading from a carbon dioxide source 100. For example, the CCSS may be integrated into a smokestack leading from a power plant or other industrial plant. Thermocell 10 and PPG 20 may be used to generate additional electric power, as further described below. Heat exchange unit 30 may be used to regulate the temperature of $CO_2$ for use in conversion tank 40. Conversion tank 40 may contain water and may facilitate the capture of $CO_2$ into cement. Some material leaving conversion tank 40 may be directed to cement processing plant 50, where materials generated in conversion tank 40 may be processed into cement.

Exemplary FIG. 2 may show the detail of thermocell 10. As shown in exemplary FIG. 1, thermocell 10 may be placed close to a carbon dioxide source 100, which may allow it to convert the maximum heat available in any emissions or gasses passing through pathway 5. Thermocell 10 may have two plates, an inside plate 11 and an outside plate 12. Inside plate 11 may be an electrode, for example an anode, placed inside pathway 5. Outside plate 12 may be an electrode, for example a cathode, placed outside pathway 5. Plates 11, 12 may be joined by semiconductor 15. Semiconductor 15 may extend through the wall 14 of pathway 5 to connect plates 11, 12. The thickness of wall 14 may function as an insulator separating two electrodes, for example plates 11, 12. Additionally, a heat insulator may be placed on both sides of wall 14 to increase the temperature difference and thereby increase the efficiency of power generation by thermocell 10.

Thermocell 10 may generate an electric current through thermoelectric means. For example, the interior of pathway 5 may be very hot and may heat inside plate 11. The temperature gradient between plates 11, 12 may then enable thermocell 10 to generate a current. The electric power generated by thermocell 10 may be stored in a battery 13, used directly, or as desired. The equation for determining the potential thermoelectric energy created by thermocell 10 is:

$$V=a(T_h-T_c)$$

Where V is the voltage produced, a is the Seebeck coefficient, $T_h$ is the temperature of the hot electrode, and $T_c$ is the temperature of the cold electrode.

Exemplary FIG. 2a illustrates the thermoelectric energy generation of thermocell 10. Inside plate 11 and outside plate 12 may be constructed of the same or different materials to generate the thermoelectric effect. For example, plates 11, 12 may be constructed of different compositions of carbon nanotube materials. The current 13 produced can then be stored or used to do work.

Now referring to exemplary FIG. 3, a pressure power generating device (PPG) 20 may be placed inside pathway 5 to generate power. Gasses moving through pathway 5 may enter an opening 24 and may push against blades 22 before exiting through opening 25. Blades 22 may rotate an axis 29 to turn a stator/dynamo 26, which may generate an electric current. Blades 22 may be considered together as one or more turbines rotating on axis 29.

PPG 20 may be affixed to wall 14 by shock-resistant absorbers 23. Axis 29 may rotate inside bearing 28, which itself may be fixed to a support bar 21. Instead of using bearing 28, axis 29 may also be suspended in a magnetic field so as to reduce friction to a minimum and thus increase efficiency of the device. Electric current generated by PPG 20 may be stored in battery 27, used to do work, or as desired.

Referring generally to exemplary FIGS. 2-3, one or more power-generation subsystems may be disclosed. According to at least one exemplary embodiment, the electricity generated by these subsystems may be used to power other portions of a carbon dioxide sequestration system, for example pumps and valves and other components as described below.

Figure 4:
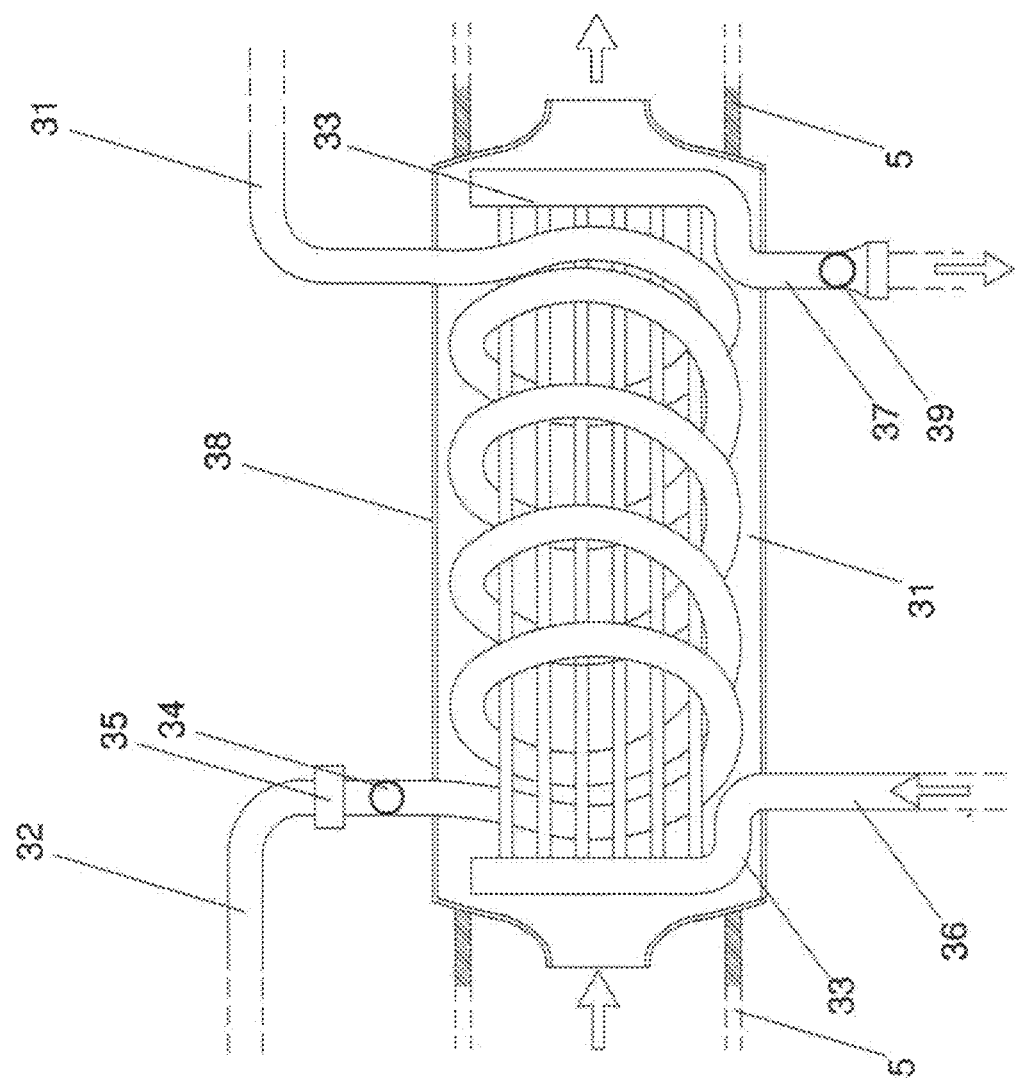
FIG. 4 shows detail of a heat exchange unit Exemplary

Now referring to exemplary FIG. 4, a heat exchange unit 30 may include one or more exchange pipes 31, 33. According to at least one exemplary embodiment, an exchange pipe 31 may be used with sea water and an exchange pipe 33 may be used with fresh water. Fresh water intake 36 may lead to exchange pipe 33, which may have an outflow 37 controlled by sensor 39. Sensor 39 may be used to control the temperature of water flowing out of exchange pipe 33. Heated fresh water flowing out from outflow 37 may be used for household or industrial use, or as desired. Exchange pipe 31 may have an outflow 35 controlled by sensor 34. Sensor 34 may be used to control the temperature of water flowing out of exchange pipe 31. Sensor 34 may also be used to control the amount of heat exchanged to a fresh water exchange system and/or to control the temperature of gas passing through pathway 5.

Figure 5:
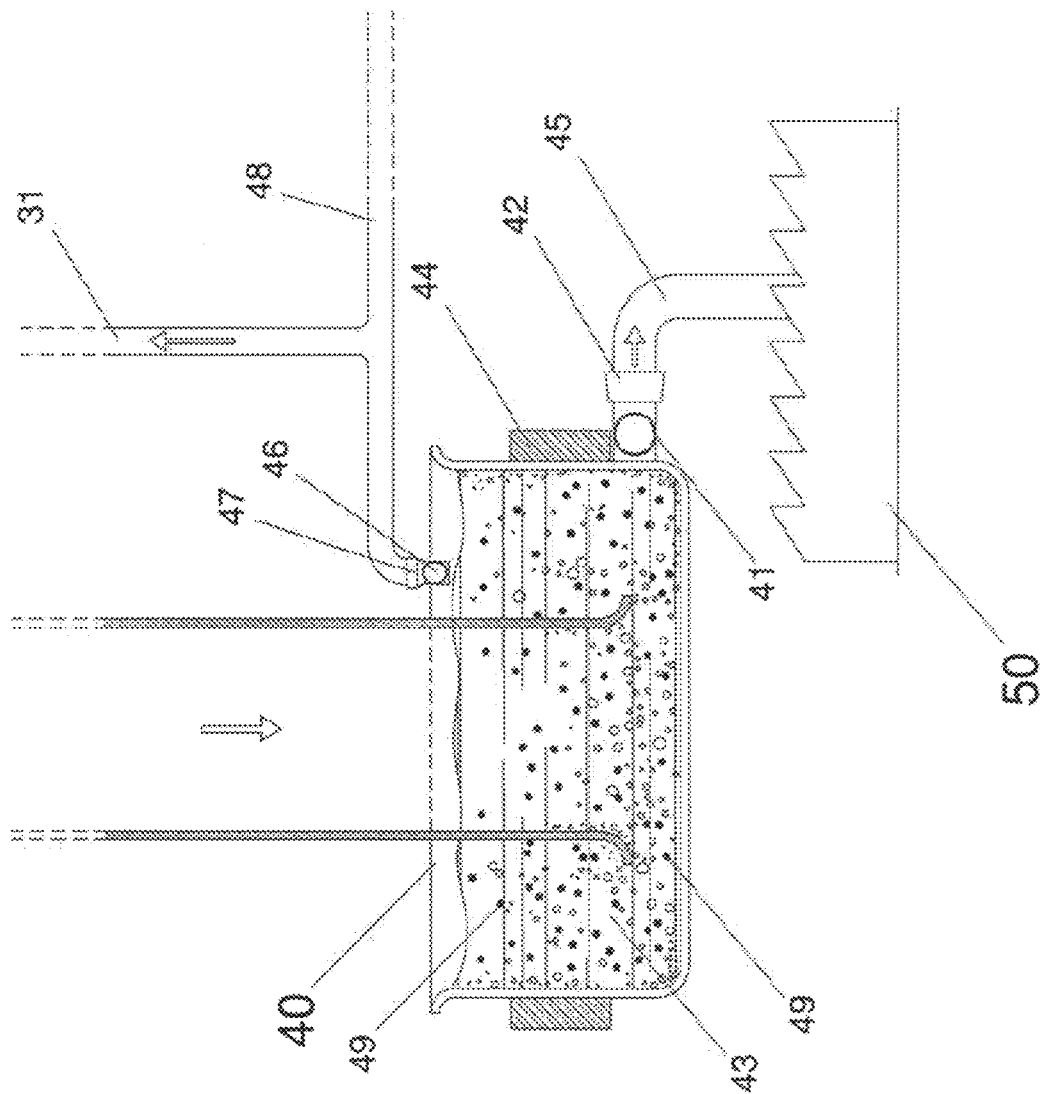
FIG. 5 shows detail of a conversion tank for the processing of carbon dioxide Exemplary

Now referring to exemplary FIG. 5, a conversion tank 40 may be placed at the end of pathway 5 and may contain seawater 43 and a catalyst 49. Seawater 43 may also be any suitable solvent containing dissolved elements suitable for conversion into carbonate minerals. $CO_2$ entering conversion tank 40 may react with sea water 43 and catalyst 49 to create carbonates from the dissolved minerals in the sea water, for example magnesium and calcium carbonates, which may later be extracted and used, for example in the creation of cement. The sequestration of carbon dioxide into carbonates is known in nature, for example sea creatures creating their shells from dissolved carbon in the sea water, but this process is not fast enough to be used at room temperature or atmospheric pressure without a catalyst. Catalyst 49 may be any suitable catalyst, for example, nickel nanoparticles. Because different catalysts work more efficiently at different temperatures, according some embodiments, heat exchange unit 30 may be utilized to control the temperature of gasses passing through pathway 5 and into conversion tank 40. In one exemplary embodiment, heat exchange unit 30 may be used to bring the temperature of the gases down to about 20° C., or approximately room temperature, for use of a nickel nanoparticle catalyst. Some embodiments may preferably use nickel nanoparticles in part because the relative production and operating costs associated with nickel nanoparticles is very low compared to other catalysts suitable for this reaction. For example, nickel is cheap, is magnetic and therefore re-useable using a magnetic separator, and is active at a wide range of pH levels.

Conversion tank 40 may additionally include sensor 41 which may control a valve 42. Sensor 41 may open valve 42 to allow the outflow of material once a desired saturation point of carbonates has been achieved. Outflow may pass through a pipe 45 to processing plant 50. Processing plant 50 may be, for example a cement processing plant. Pipe 45 may also lead to a storage container, a transportation container, or as desired. To prevent the loss of catalyst, a separator 44 may be used. Separator 44 may be, for example, an electromagnet, or a permanent magnet which may be moved into or out of a functional range. Separator 44 may be used to control the amount of catalyst 49 dispersed in conversion tank 40. For example, when it is desired to drain outflow from conversion tank 40, separator 44 may first be activated to draw and hold catalyst 49 in place, for example against the sides of the container. Valve 42 may then be opened to allow outflow of desired materials without significant loss of catalyst 49. Catalyst 49 may therefore be used repeatedly, significantly lowering costs.

Conversion tank 40 may also include sensor 46 controlling valve 47. Valve 47 may lead from water pipe 48. Water pipe 48 may provide a source of sea water for conversion tank 40. Sensor 46 may detect when conversion tank 40 has been drained of sea water 43 and may open valve 47 to allow more sea water in to replenish the supply. Following the refilling of the container, separator 44 may release the catalyst back into the sea water 43, allowing the sequestration reaction of carbon dioxide to restart.

Carbonates received in processing plant 50 may be separated from sea water and processed into white cement. In one embodiment, white cement may be advantageous in other applications because it reflects sunlight, preventing the over-absorption of heat, and therefore can assist in slowing global warming. Alternatively, the carbonates can be used in any known way, such as filler or additive in polymer compounds, acid-free papermaking, ceramic tile adhesives, flooring, fireproofing, and medical and pharmaceutical applications, or as desired.

Figure 6:
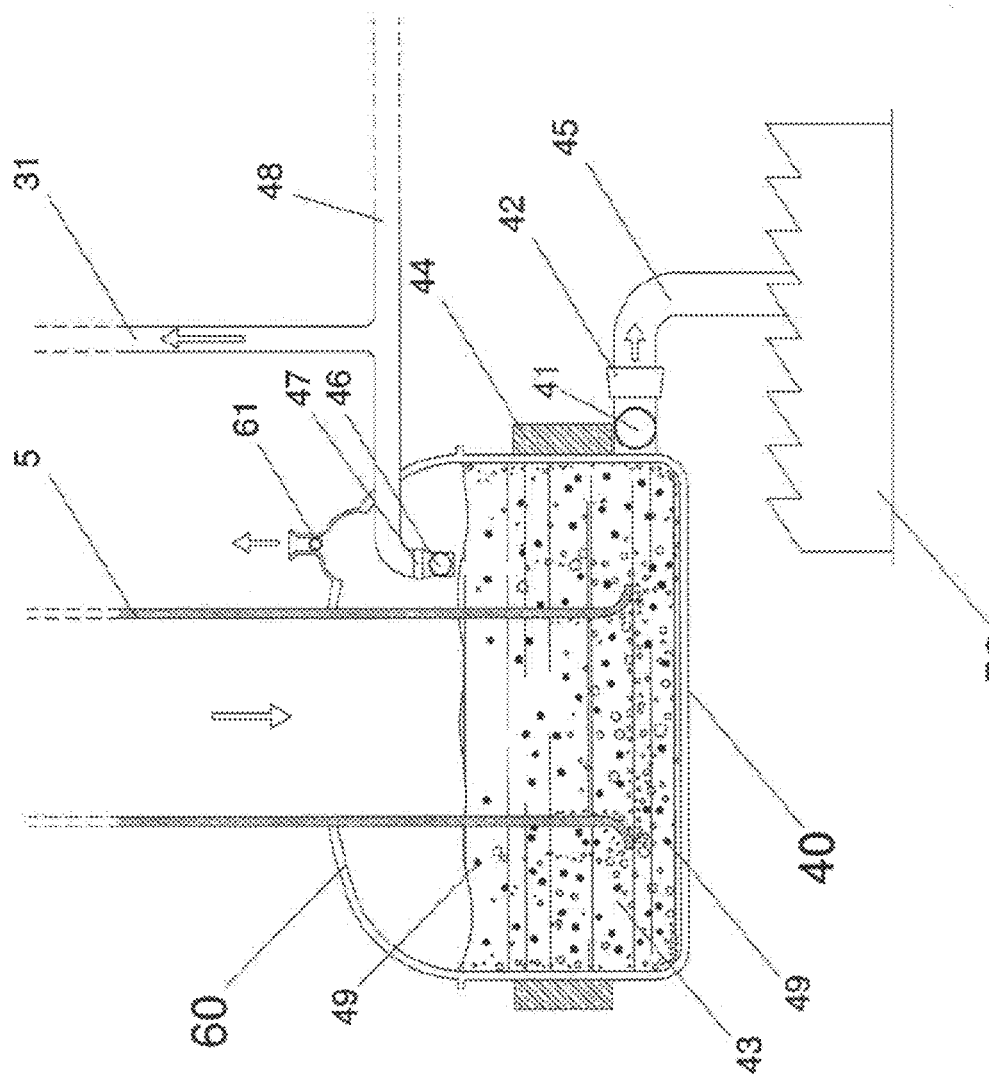
FIG. 6 shows an alternate embodiment of a conversion tank with a cover on top Exemplary

Exemplary FIG. 6 shows an alternate embodiment of conversion tank 40 with a cover 60. Cover 60 may include a sensor 61 which may control the outflow of gasses into the atmosphere. For example, sensor 61 may detect the levels of carbon dioxide remaining inside conversion tank 40 and may only allow gases to leave when a desired amount of $CO_2$ has been sequestered.

In use, one or more of the above-mentioned systems may be used alone or in combination to reduce $CO_2$ emissions into the atmosphere and/or to create additional energy output using, for example, otherwise wasted industrial emissions. Though exemplary FIG. 1 shows one possible layout, different layouts and orderings of the systems are possible. According to at least one exemplary embodiment, thermocell 10, PPG 20, heat exchange unit 30, and conversion tank 40 may function together as an integrated system achieving high efficiency of power production and carbon sequestration. In one embodiment, gases emitted by an industrial plant at a few hundred degrees Celcius may be cooled by thermocell 10 and heat exchange unit 30, slowed by PPG 20, and excess carbon dioxide may be sequestered by conversion tank 40. Additionally, some embodiments may further include a central control unit (not shown) which may coordinate the different components of an integrated system.

According to another exemplary embodiment, the above CCSS process may be advanced, meliorated and the energy generation brought to a higher level. In another exemplary embodiment, the jet stream coming out of any industrial smokestack may be first mitigated to allow the actual capture and conversion process in which first the jet pressure may be reduced and harnessed to produce electric power through a wind-rotor like. Then, the heat in the jet stream may be mitigated to down, for example, 20° C. to allow the chemical reaction inside the $CO_2$ reactor to take place at this optimum temperature while harnessing the heat in said jet stream to produce again electric power through a thermocell place directly on a heat exchanger to increase temperature difference, so power may be generated. After the conversion of $CO_2$ into calcium and magnesium carbonates, the waste sea water may be again harnessed in a so-called ionic cell IC in which the salt ions are split into positively charged ions and negatively charged ions by which process a huge amount of electric power may be harnessed. There may be a significant amount of electric power produced (for example, over 4.86 watts/cm2) since huge solar energy is stored in sea water.

Total solar irradiance (TSI)—the amount of solar radiation received at the surface of earth may be, for example, 1.361 kilowatts per square meter ($kW/m^2$). Based upon the laws of thermodynamics, specifically the first law of thermodynamics, the law of conservation of energy states that the total energy of an isolated system is constant; energy can be transformed from one form to another, but can be neither created nor destroyed. Energy can, thus neither destroyed or created but can only be transformed or absorbed by the sea water during the time of day sun shine and is not lost but conserved within the molecules of the seawater. Some energy could be lost through evaporation and wave energy dissipation under entropy rules, but a whole lot can be still conserved in the ionic structure of the water molecules that theoretically could be harnessed. Therefore, another exemplary embodiment may harness this energy by converting it into electrical power/energy Further, according to another exemplary embodiment, the converted calcium and magnesium material produced inside a $CO_2$ reactor may also be processed further into a specific useful type of cement, for example, so-called "Cementum Romanum", in which a certain mixture is used to create a material for building construction and/or road construction. Such a processing may convert magnesium and calcium present in sea water through a simple chemical reaction using a naturally abundant element (for example, catalyst) into magnesium and calcium carbonates.

According to an exemplary embodiment, Seawater-Ionic Cell (IC) using sea water residue from $CO_2$ reactor and creating a two different ionic concentration cell in which current may flow generating electric power. Also, in another exemplary embodiment, Thermocell 10 may be integrated within heat exchanger 30 for an advantage that a cold water in coming may be much cooler than an outside of smoke stack, so temperature difference may greater.

Further, in another exemplary embodiment, the gained calcium carbonate from the $CO_2$ reactor 40 may be heated to, for example, 900° C. in order to mix and pozzolana (volcanic ashes) in a ratio of, for example, 30% carbonates to 60% pozzolana and 10% seawater to produce the Roman concrete or "cementum" for street paving and/or building construction.

Figure 7:
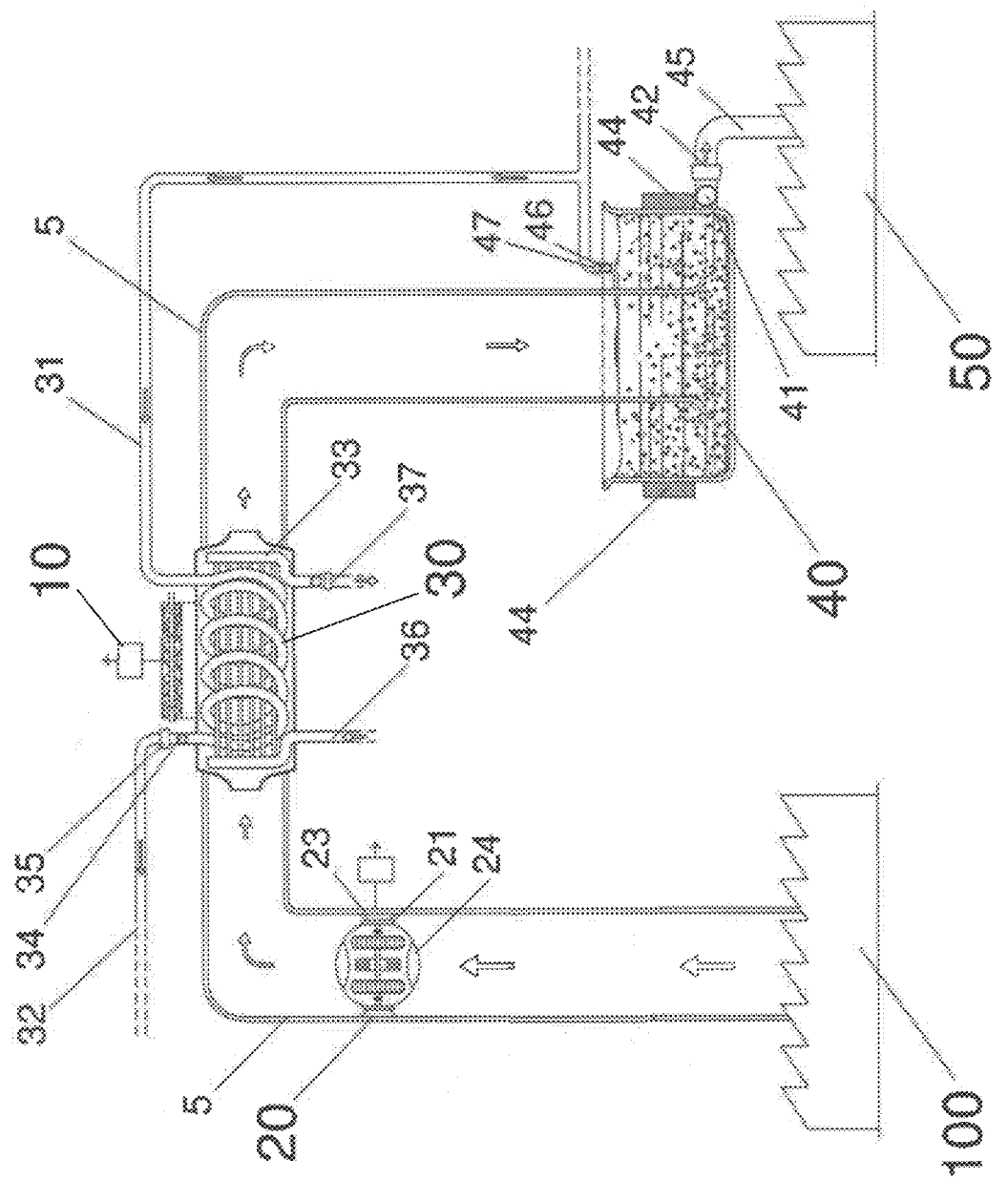
FIG. 7 shows an arrangement of another embodiment of the CCSS where the thermocell is integrated above the heat exchanger.

Turning now to exemplary FIG. 7, FIG. 7 may show an arrangement of another embodiment of the CCSS where the thermocell is integrated above the heat exchanger. According to an exemplary embodiment, the thermocell 10 may be placed on top of the heat exchanger 30. As described above, such a position of the thermocell 10 may ensure higher efficiency of the system with the maximum temperature difference and electric power output. According to an exemplary embodiment, to maximize Peltier/Seebeck effect, the thermocell 10 may be made of SeSn, tin solenide which has very high Seebeck coefficient (also known as thermopower, thermoelectric power, and thermoelectric sensitivity) and high ZT (temperature-independent figure-of-merit). Such materials, tin solenide and SeSn, are based on the common semiconductor telluride and environmentally stable being expected to convert, for example, from 15 to 20 percent of heat to electricity. The SeSn material may exhibit a thermoelectric figure or, for example, ZT of 2.2.

Turning now to exemplary FIG. 8, FIG. 8 may show a high concentration lens deposed over a container assembly (solar chamber). According to an exemplary embodiment, a high concentration lens 51 may be placed over a container assembly (solar chamber) 50' in order to focus solar heat on the lower calcium carbonate gained from the CCSS reactor. The focal point of the lens 51 may be pointing to a disc of black graphene composite material 54. The space between the material 55 and the solar lens 51 may be calculated to ensure precise focal point concentration of solar heat where the carbon nanotube layer 53 is placed.

Turning now to exemplary FIG. 9, FIG. 9 may show configurations for another embodiment of the CCSS with an ionic cell. According to an exemplary embodiment, the released seawater through tube 45 may be conducted to an ionic cell IC 60 in which seawater may harnessed to generate electrical power.

Figure 9B:
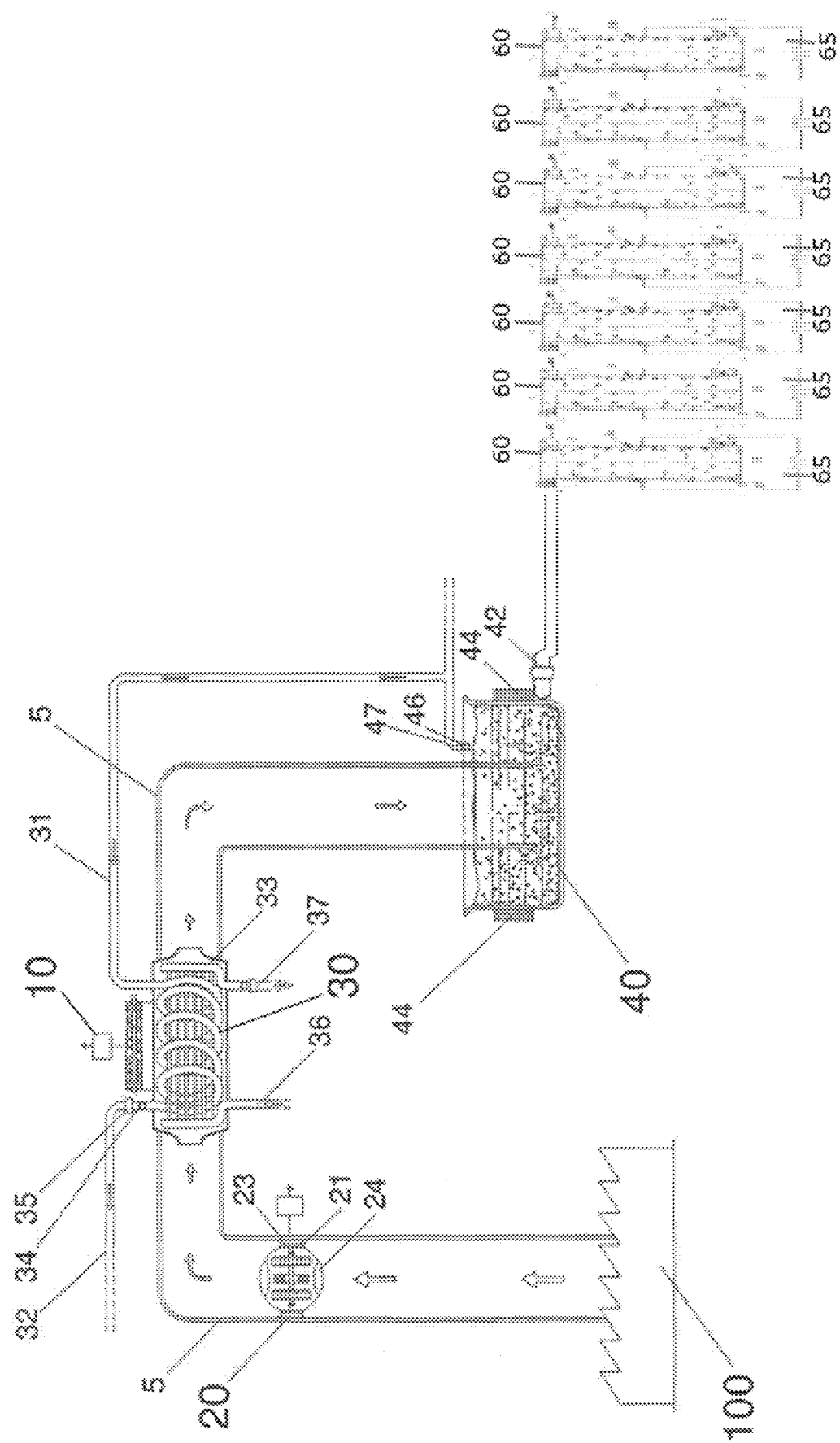
FIG. 9b shows a plurality ionic cells ICs connected in series Exemplary

Turning now to exemplary FIGS. 9a and 9b, FIG. 9a may show configurations of the ionic cell in which seawater is harnessed, and FIG. 9b may show a plurality of ionic cells (ICs) connected in series to generate maximum amount of electric power. According to an exemplary embodiment, a membrane 61 may be included, which may be made of a graphene oxide polymer material with nano pores of, for example, 3.5-4 nanometers in order to allow ions to pass through these tiny holes. The membrane may be negatively charged to allow only the positive ions 62 to slip over the other side B from the left side A in which both positive and negative salt ions are available. Seawater may be conducted through tube 66 in and once the solution is saturated with positive ions the seawater may be released through solenoid vales 63 and 67 which are equipped with sensors to allow the replacement of the seawater in after emptying the two containers (A and B). Electrodes may be then connected on the two sides of the assembly to produce electric current in a coil (or any kind of electric load such as a resistance or rechargeable battery) 65 at high throughput electricity energy of the said membrane 61.

Therefore, according to an exemplary embodiment, the calcium and magnesium carbonates 55 from $CO_2$ reactor may be conducted through tube 45 to next phase in ICs 60 in two phases:

1. The seawater is removed from solar chamber 50' through a sensor 41 and a solenoid valve and/or a filter 42, a filter to keep all carbonates inside said solar chamber 50' which is encapsulated in heat resistant and insulating material 56.
2. The salted seawater is then poured into ionic cell IC 60 in order to generate electric power. The concentrated solar chamber 50' itself is made of highly insulated material to keep the heat trapped inside in order to reach, for example, temperatures of, for example, 900° C. In case this temperature is not reached (in very cold countries or winter time where the sun is not strong enough) a separate electric heater may be inserted (not shown in drawings) to bring the desired temperature required for the Cementum Romanum needed material.

According to an exemplary embodiment, the solenoid valve 52 may be equipped with a sensor to release the carbonates once the required temperature is reached.

Figure 10:
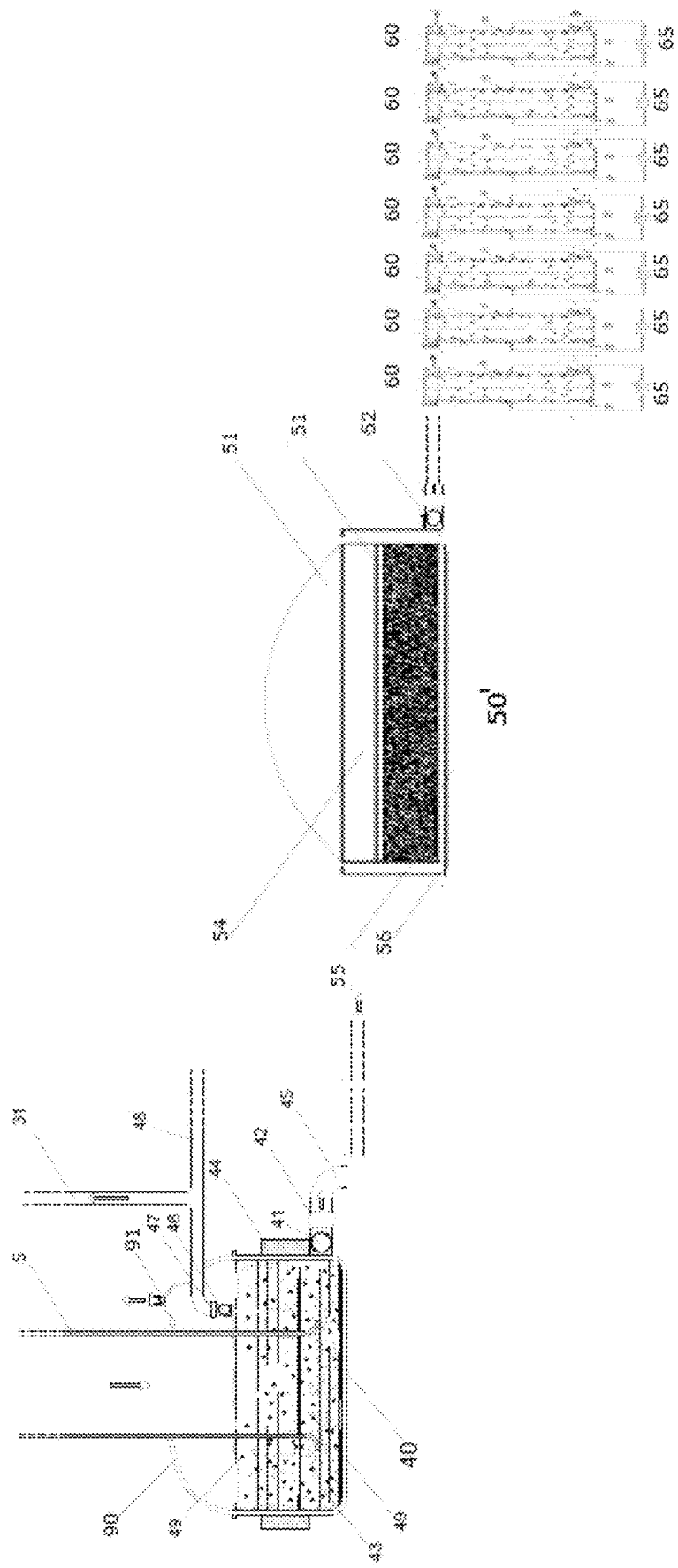
FIG. 10 shows the $CO_2$ reactor in sealed form.

Turning now to exemplary FIG. 10, FIG. 10 may show the $CO_2$ reactor in sealed form. According to an exemplary embodiment, an $CO_2$ reactor 40 may be sealed by a cover 90 and include an opening valve with sensor 91 to release the $CO_2$ free and non-polluted air out to be replaced by more $CO_2$ loaded and polluted jet from the smokestack. A valve 45 may be connected to the solar concentration chamber 50' where the calcium and magnesium carbonates are first poured into and then passed to ionic cells 60 for electric power generation. The remaining carbonates in solar chamber 50' may be then washed by fresh water to remove the salt residuals.

The foregoing description and accompanying figures illustrate the principles, preferred embodiments and modes of operation of the invention. However, the invention should not be construed as being limited to the particular embodiments discussed above. Additional variations of the embodiments discussed above will be appreciated by those skilled in the art.

Therefore, the above-described embodiments should be regarded as illustrative rather than restrictive. Accordingly, it should be appreciated that variations to those embodiments can be made by those skilled in the art without departing from the scope of the invention as defined by the following claims.

What is claimed is:

1. A system for sequestering carbon dioxide, comprising:
   a gas pathway having with a first end and a second end;
   a gas input provided on the first end of the gas pathway;
   a conversion chamber provided on the second end of the gas pathway and containing a solvent and a catalyst;
   a pressure power generator provided on the gas pathway and having at least one bladed turbine;
   a heat exchanger provided on the gas pathway and having at least one exchange pipe; and
   a thermocell generator provided on the heat exchanger;
   wherein the conversion chamber is configured to sequester carbon dioxide in a different chemical compound.

2. The system for sequestering carbon dioxide of claim 1 further comprises a solar chamber connected with the conversion chamber.

3. The system for sequestering carbon dioxide of claim 2, wherein the solar chamber is insulated with heat resistant material, contains carbonates which are from the conversion chamber, a carbon nanotube layer and a disc of black graphene composite material are provided over the carbonates, and at least one concentration lens is provided over the solar chamber.

4. The system for sequestering carbon dioxide of claim 2, wherein the solar chamber includes a valve with a sensor to release carbonates which are from the conversion chamber and contained in the solar chamber once a predetermined temperature is reached in the solar chamber.

5. The system for sequestering carbon dioxide of claim 1 further comprises at least one ionic cell connected with the conversion chamber.

6. The system for sequestering carbon dioxide of claim 5, wherein the at least one ionic cell includes a first space and a second space, and the first space and the second space are divided by a membrane of the ionic cell.

7. The system for sequestering carbon dioxide of claim 6, wherein the at least one ionic cell contains the solvent which is from the conversion chamber, the membrane has pores, and the membrane is charged negatively or positively so that ions of the solvent slip over from the first space to the second space via the pores of the membrane.

8. The system for sequestering carbon dioxide of claim 7, wherein each of the first space and the second space are connected to an electric load via electrodes, and an electricity is generated in response that the ions of the solvent are saturated to the first space or the second space.

9. The system for sequestering carbon dioxide of claim 8, wherein the at least one ionic cell includes a valve with a sensor to release the solvent from the first space and second space after generating the electricity.

10. The system for sequestering carbon dioxide of claim 1, wherein the heat exchanger is provided on the gas pathway between the pressure power generator and the conversion chamber, and the pressure power generator is provided on the gas pathway between the gas input and the heat exchanger.

11. The system for sequestering carbon dioxide of claim 1, wherein the solvent is sea water and the catalyst is nickel nanoparticles.

12. The system for sequestering carbon dioxide of claim 1, further comprising a separator, the separator configured to control whether or not the catalyst is dispersed in the solvent.

13. The system for sequestering carbon dioxide of claim 12, wherein the separator is a magnet.

14. The system for sequestering carbon dioxide of claim 1, wherein electricity is generated by at least one of the thermocell generator and the pressure power generator.

15. The system for sequestering carbon dioxide of claim 14, wherein at least one of the thermocell generator and the pressure power generator includes a battery, and at least a portion of the generated electricity is stored in the battery.

16. The system of for sequestering carbon dioxide of claim 1, wherein the thermocell generator comprises at least two electrodes, and wherein at least one of the at least two electrodes further comprises carbon nanotubes.

17. The system for sequestering carbon dioxide of claim 1, wherein the heat exchanger further comprises a first water pipe system and a second water pipe system, wherein the first water pipe system is configured to hold fresh water and the second water pipe system is configured to hold salt water.

18. The system for sequestering carbon dioxide of claim 1, wherein the pressure power generator generates electricity by using a physical force of a gas moving through the gas pathway.

19. The system for sequestering carbon dioxide of claim 1, wherein the thermocell generator generates electricity using a heat energy of a gas moving through the gas pathway.

* * * * *